United States Patent
Logan et al.

(10) Patent No.: US 9,941,179 B2
(45) Date of Patent: Apr. 10, 2018

(54) CAPACITIVE MEASUREMENTS OF DIVOTS IN SEMICONDUCTOR DEVICES

(71) Applicant: INTERNATIONAL BUSINESS MACHINES CORPORATION, Armonk, NY (US)

(72) Inventors: Lyndon R. Logan, Poughkeepsie, NY (US); Edward J. Nowak, Essex Junction, VT (US); Robert R. Robison, Colchester, VT (US); Yan He, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 316 days.

(21) Appl. No.: 14/742,917

(22) Filed: Jun. 18, 2015

(65) Prior Publication Data
US 2016/0370311 A1    Dec. 22, 2016

(51) Int. Cl.
*G01N 27/22* (2006.01)
*H01L 23/64* (2006.01)
(Continued)

(52) U.S. Cl.
CPC .............. *H01L 22/34* (2013.01); *H01L 22/14* (2013.01)

(58) Field of Classification Search
CPC .............. G01N 27/228; G01N 27/221; G01N 33/2852; G01N 27/223; G01N 27/226;
(Continued)

(56) References Cited

U.S. PATENT DOCUMENTS 6,040,199 A    3/2000  Kimura et al.
6,964,875 B1   11/2005 En et al.
(Continued)

FOREIGN PATENT DOCUMENTS

CN    103928442      7/2014
JP    2005142304     6/2005
KR    1020080029699  4/2008

OTHER PUBLICATIONS

A. M. Elshurafa et al. "Achieving nanoscale horizontal separations in the standard 2 Im PolyMUMPS process", Appl Nanosci (2014) 4:241-246.
(Continued)

*Primary Examiner* — Jermele M Hollington
*Assistant Examiner* — Suresh K Rajaputra
(74) *Attorney, Agent, or Firm* — Anthony Canale; Andrew M. Calderon; Roberts Mlotkowski Safran, Cole & Calderon, P.C.

(57) ABSTRACT

Approaches for characterizing a shallow trench isolation (STI) divot depth are provided. The approach includes measuring a first capacitance at a first region of a substrate where at least one first gate line crosses over a boundary junction between a STI region and an active region. The approach also includes measuring a second capacitance at a second region of the substrate where at least one second gate line crosses over the active region. The approach further includes calculating a capacitance associated with a divot at the first region based on a difference between the first capacitance at the first region and the second capacitance at the second region.

20 Claims, 3 Drawing Sheets

(51) Int. Cl.
*H01L 29/06* (2006.01)
*H01L 21/66* (2006.01)

(58) Field of Classification Search
CPC ... H01L 22/14; H01L 29/0653; H01L 23/642; H01L 22/34; H03K 17/955
See application file for complete search history.

(56) References Cited

U.S. PATENT DOCUMENTS

| | | |
|---|---|---|
| 8,629,435 B2 | 1/2014 | Tsai et al. |
| 8,723,177 B2 | 5/2014 | Lutz |
| 2005/0127423 A1 | 6/2005 | Hsu |
| 2013/0228778 A1* | 9/2013 | Tsai ................ G01B 7/082 257/48 |
| 2014/0266291 A1 | 9/2014 | Fkih et al. |

OTHER PUBLICATIONS

Hsu et al., "In Line Monitoring of Shallow Trench Isolation Divot Depth", © 2007 Veeco Instruments, 4 pages.
Shimasue et al.,"An Accurate Measurement and Extraction Method of Gate to Substrate Overlap Capacitance", Proc. IEEE 2004 Int. Conference on Microelectronic Test Structures, vol. 17, Mar. 2004. 4 pages.

* cited by examiner

US 9,941,179 B2

CAPACITIVE MEASUREMENTS OF DIVOTS IN SEMICONDUCTOR DEVICES

The invention relates to a method and test structure for capacitive measurement of a divot formed in semiconductor devices, and more particularly, to a method and test structure for inline signal divot monitoring for process control feedback.

BACKGROUND

The trend in semiconductor device fabrication towards increasing density of circuit components requires that smaller areas of the circuit be devoted to isolation of the circuit components and capacitive storage devices. The need to reduce the surface area used for circuit components such as isolation structures and large area capacitor devices has resulted in the development of structures vertically oriented with respect to the plane of the substrate surface. These vertical structures typically consist of some type of trench structure in the semiconductor substrate and positioned between charge carrying components of adjacent transistors. The utilization of a trench structure enables the formation of a structure having large volume while minimizing the amount of surface area consumed.

The formation of vertically oriented isolation structures does not eliminate the possibility of current leakage paths. Accordingly, various isolation techniques have been developed and are used in advanced integrated circuitry to electrically isolate the various devices in the semiconductor substrate. One example of such an isolation technique is shallow trench isolation (STI), which is used in IC chips to provide higher device densities and better planarity than other isolation methods. In this technique, a STI area is defined to form isolation trenches surrounded by areas of wafer having a pad oxide layer and a polish-stop nitride layer on the surface. The isolation trench is then thermally oxidized to form a thin oxide layer on the isolation trench surfaces. A thin nitride layer is often deposited inside the isolation trench surfaces to prevent stress during the subsequent oxidation steps because the stress causes dislocations in the silicon wafer. Then, the isolation trench is filled with a chemical vapor deposited (CVD) oxide and chemically mechanically polished (CMP) back to the polish-stop nitride layer to form a planar surface. The polish-stop nitride layer is then removed. At this time, if there is a nitride liner, exposed areas of the nitride liner are etched back as well, which creates a divot. Even without a nitride liner, a divot can still form in the gate surface adjacent to the silicon due to stress. The pad oxide is then removed by a wet etch, which may cause the divot to grow. The gate oxide is then grown on the silicon wafer surface, and hi-k dielectric gate material is deposited. When the dielectric gate material is deposited, it will fill the divot, causing extra capacitance and possibly generating an out of control "foot short". If a foot short is generated due to a divot filled with gate material, yields may plummet.

SUMMARY

In a first aspect of the invention, there is a method which includes measuring a first capacitance at a first region of a substrate where at least one first gate line crosses over a boundary junction between a shallow trench isolation (STI) region and an active region. The method also includes measuring a second capacitance at a second region of the substrate where at least one second gate line crosses over the active region. The method further includes calculating a capacitance associated with a divot at the first region based on a difference between the first capacitance at the first region and the second capacitance at the second region.

In another aspect of the invention, there is a test structure which includes a first contact at a first region where at least one gate line crosses over a boundary junction between a shallow trench isolation (STI) region and an active region of a substrate for measuring a first capacitance. The test structure also includes a second contact at a second region where at least one second gate line crosses over the active region of the substrate for measuring a second capacitance.

In another aspect of the invention, there is a method which includes providing a first contact at a first region of a substrate where an outer pair of electrically connected gates crosses over a boundary junction between a shallow trench isolation (STI) region and an active region. The method further includes providing a second contact at a second region of the substrate where an inner pair of electrically connected gates cross over the active region. The method also includes measuring a first capacitance at the first contact and a second capacitance at the second contact. The method further includes calculating a divot capacitance of a divot location based on a different between the first capacitance at the first contact and the second capacitance at the second contact.

DETAILED DESCRIPTION

The invention relates to a method and test structure for capacitive measurement of a divot formed in semiconductor devices, and more particularly, to a method and test structure for inline signal divot monitoring for process control feedback. In embodiments, the test structure can determine dimensions, e.g., measuring a depth-calibrated capacitive signal on the semiconductor device.

More specifically, the present invention relates to a method and structure of determining a depth of a shallow trench isolation (STI) divot. The structure can be implemented using the method comprising providing an active silicon region surrounded by STI isolation and forming an inner pair of electrically connected gates crossing the active silicon region. The method further comprises forming an outer pair of electrically connected gates crossing the boundary between the STI and active silicon region, wherein the outer pair surrounds the inner pair. The method further comprises forming electrical contacts to the active silicon region between the inner pair of gates and the outer pair of gates respectively. The depth of the STI divot can be determined from a difference in measured gate capacitances from the inner gates to active silicon region and the outer gates to active silicon region at a set of voltages. In this way, unlike current destructive testing (e.g., TEM cross sections, cleave at wafer level, etc.), embodiments of the invention provide a non-destructive testing method, which includes providing an inline signal for divot monitoring and providing quick process control feedback. Further, embodiments of the invention allow for characterizing divot depth earlier in the manufacturing process than known methods and structures. Thus, embodiments of the invention allow for a test structure to be placed on the kerf of the semiconductor device to allow for an inline signal to determine divot depth.

Figure 1:
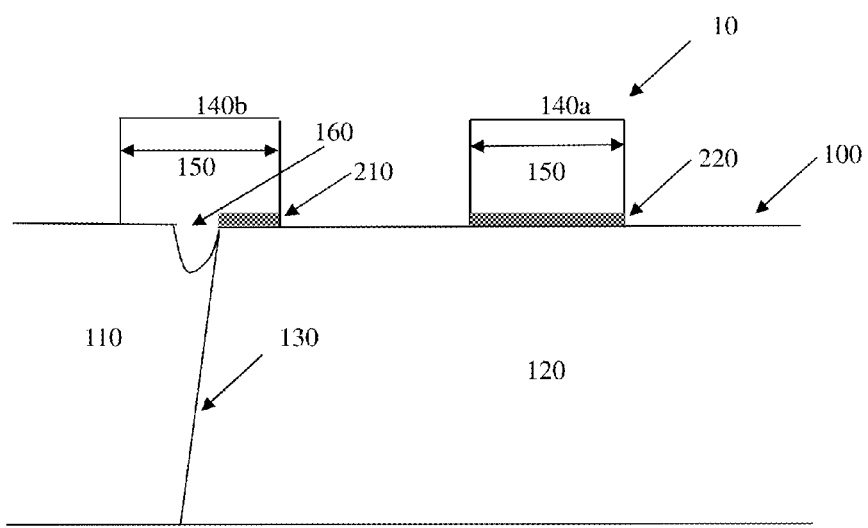
FIG. 1 shows a schematic view of a semiconductor structure with a divot that can be measured in accordance with aspects of the invention.

FIG. 1 shows a schematic view of a semiconductor device with a divot that can be measured in accordance with aspects of the invention. Specifically, FIG. 1 shows a semiconductor device 10 which includes a substrate 100, polysilicon (PC) 140a and 140b lines of gate material, and a divot 160. For example, the substrate 100 may be composed of any suitable material including, but not limited to, Si, SiGe, SiGeC, SiC, GE alloys, GaAs, InAs, InP, and other III/V or II/VI compound semiconductors. Further, the substrate 100 comprises a RX region 120 (i.e., an active region) and a shallow trench isolation (STI) region 110 (i.e., an isolated region). Further, a STI boundary 130 is at an edge of the STI region 110 and the RX region 120. PC 140a and 140b lines of gate material have a length Lpoly 150, as shown in FIG. 1.

In the semiconductor device of FIG. 1, the divot 160 may be formed during a number of different clean and etch processes (e.g., clean and etch processes can occur during a channel sige process). For example, the divot 160 may be formed when oxide is etched at a top corner of the STI boundary 130. Further, the divot 160 may be filled with hi-k gate material or metal gate material during a deposition process. Other process steps, such as carbon implantation, may further erode the STI boundary 130. However, since PFET and NFET have different vertical channel levels, overfilling the STI region 110 will not solve the erosion problem at the STI boundary 130. As shown on the left side of FIG. 1, the STI boundary 130 is under a PC 140b in a tucked position.

The length of the divot 160 may vary in different semiconductor devices, but is typically around 2-20 nm. In embodiments, any divot 160 below 5 nm is defined as a basic variation that is used as a reference point and will most likely occur when the PC 140 is completely over the RX region 120, as shown on the right side of FIG. 1. Further, any divot 160 below 5 nm may not cause any shorts or yield problems during the semiconductor device manufacturing process. A divot 160 above 5 nm, which can be detected and measured, can form a metal stringer and form a short from the gate to source/drain contact region. If the divot 160 causes a short in semiconductor devices, yield rates will plummet.

In any event, in order to determine a depth of a divot, first contact 210 and second contact 220 may be placed on the semiconductor device 10. The first contact 210 and second contact 220 may each be a set of electrical contacts. Specifically, as shown in FIG. 1, the first contact 210 may be placed at a first region where a PC 140b line of gate material crosses over a STI boundary 130 between an edge of the STI region 110 and the RX region 120. The first contact 210 may be used for measuring a first capacitance at the first region. Further, as shown in FIG. 1, the second contact 220 may be placed at a second region where a PC 140a line crosses over only the RX region 120. The second contact 220 may be used for measuring a second capacitance at the second region. Moreover, the first contact 210 and second contact 220 may be part of a test structure for characterizing a divot depth.

Although FIG. 1 shows first contact 210 and second contact 220 placed directly in an active area on the semiconductor device 10, alternate embodiments are included herein. For example, first contact 210 and second contact 220 may be placed on the kerf of the semiconductor product to allow for an inline signal to determine divot depth.

Figure 2:
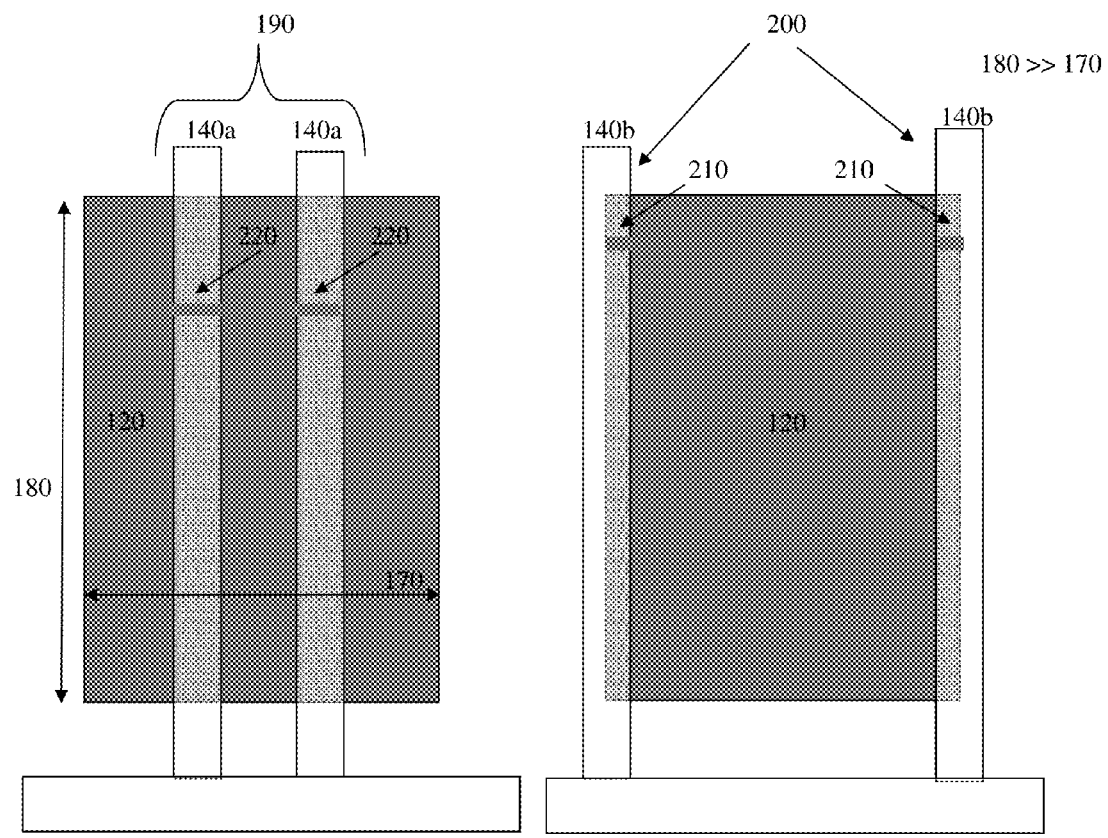
FIG. 2 shows a top schematic view of FIG. 1.

FIG. 2 shows a top schematic view of the semiconductor device of FIG. 1, with the test structures implementing the measurements in accordance with aspects of the invention. In FIG. 2, PC 140a lines are completely covering the RX region 120; whereas, PC 140b lines only partially cover the RX region 120. As shown in FIG. 2, the length of RX is $L_{RX}$ 170 and the width of RX is $W_{RX}$ 180. Further, in embodiments, $W_{RX}$ 180 is greater than $L_{RX}$ 170. In embodiments shown in FIG. 2, a first capacitance 200 (on the right side of FIG. 2), in which two PC lines 140b partially cover the RX region 120, is measured as C1. Further, a second capacitance 190 (on the left side of FIG. 2), in which two PC 140a lines completely cover the RX region 120, is measured as 2C0. On the right side of FIG. 2, the first capacitance 200 is measured as C1 because the capacitance is approximated as ½ component for each PC 140b (i.e., only approximately half of each PC 140b covers the RX region 120).

As shown in FIG. 2, the first contact 210 may be placed at a first region where a PC 140b line of gate material crosses over a STI boundary 130 between an edge of the STI region 110 (not shown) and the RX region 120. The first contact 210 may be used for measuring the first capacitance 200 at the first region. Further, as shown in FIG. 2, the second contact 220 may be placed at a second region where a PC 140a line crosses over only the RX region 120. The second contact 220 may be used for measuring the second capacitance 190 at the second region. The first contact 210 and second contact 220 may each be a set of electrical contacts. Moreover, first contact 210 and second contact 220 may be part of a test structure for characterizing a divot depth.

Figure 3:
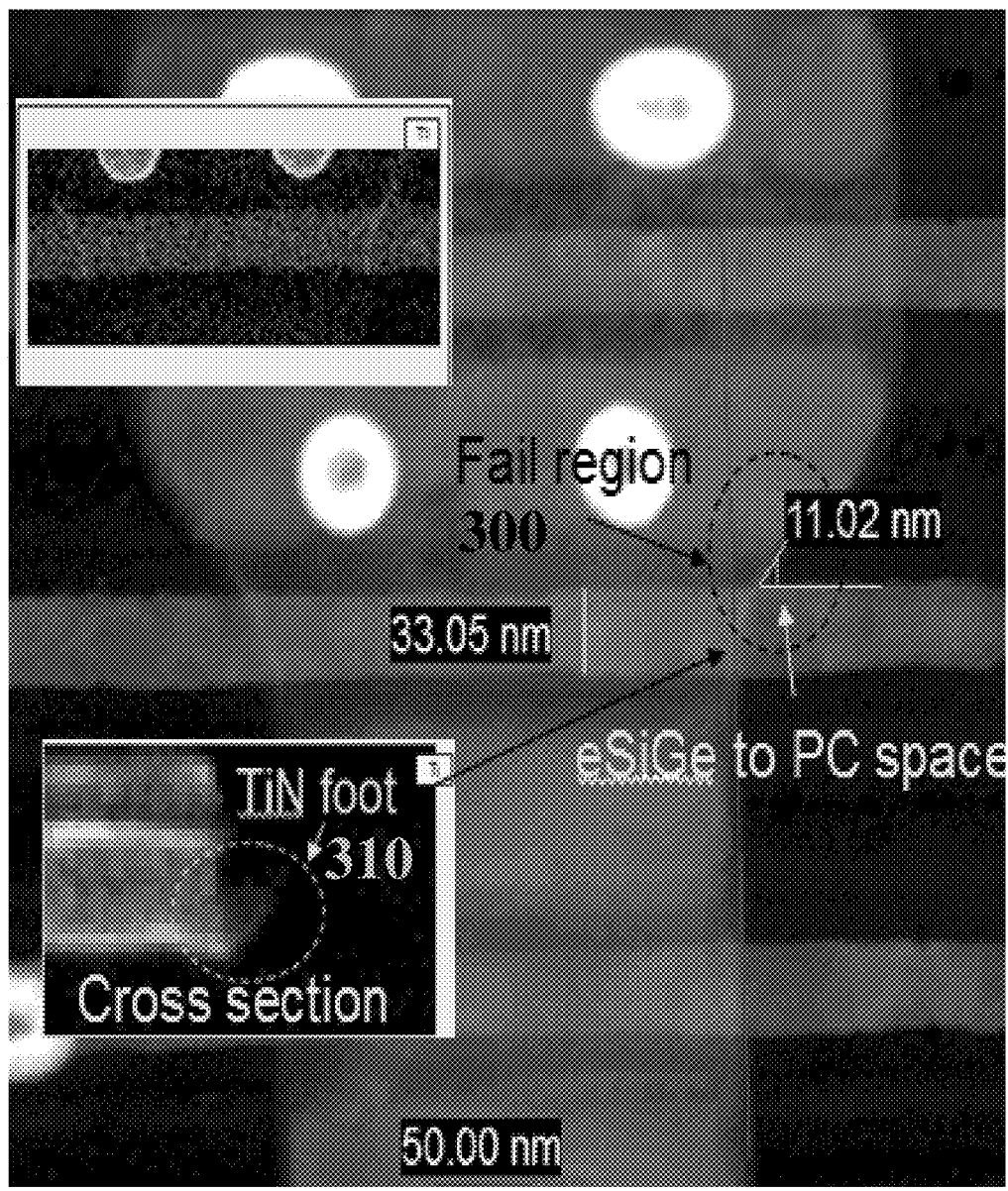
FIG. 3 shows an example of a foot short that can be measured in accordance with aspects of the invention.

FIG. 3 shows an example of a foot short which can be measured in accordance with aspects of the invention. In FIG. 3, for example, a fail region 300 of a device is illustrated with a TiN foot 310. In FIG. 3, the divot in the fail region 300 of the device becomes an out of control "foot short", which reduces yield of semiconductor devices. In this implementation, a test structure may be used to determine the depth of the out of control foot short. The test structure may include a first contact which is placed at a first region where a PC line of gate material crosses over a STI boundary between an edge of an STI region and an RX region. The test structure may also include a second contact which is placed at a second region where a PC line of gate material crosses over only the RX region. The first contact and second contact may be used for measuring a first capacitance at the first region and a second capacitance at the second region, respectively. Further, in another embodiment, the test structure may be placed on the kerf of a semiconductor device to allow for an inline signal to determine divot depth.

Figure 4:
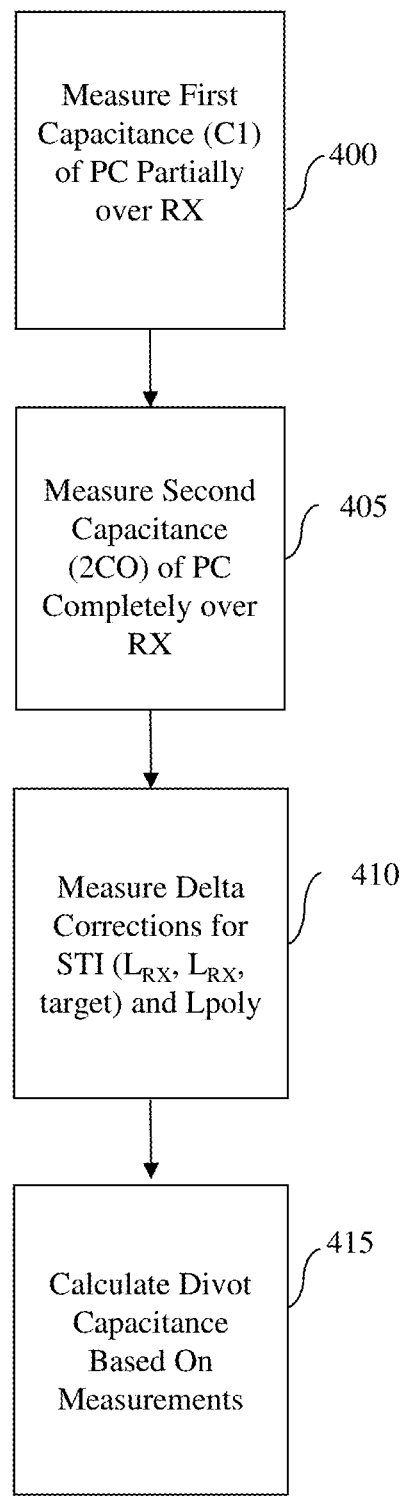
FIG. 4 shows a flow diagram of a method in accordance with aspects of the invention.

FIG. 4 shows an exemplary flow diagram for performing aspects of the present invention. The steps of FIG. 4 may be implemented on the structures shown in FIGS. 1-3. The flow diagram illustrates the architecture, functionality, and operation of possible implementations of systems, methods, and computer program products as already described herein in accordance with the various embodiments of the present invention.

FIG. 4 shows a flow diagram of a method in accordance with aspects of the invention. In FIG. 4, at step 400, a first capacitance (e.g., the first capacitance 200 of FIG. 2, or C1) of a PC (e.g., the PC 140b line of FIG. 2) which is partially covering over RX (e.g., the RX region 120 of FIG. 2) is measured by a first contact (e.g., a set of electrical contacts) at the first region. The first region is a region where a PC crosses over a STI boundary between an edge of a STI region and a RX region. Then, at step 405, a second capacitance (e.g., the second capacitance 190 of FIG. 2, or 2C0) of a PC (e.g., the PC 140a line of FIG. 2) which is completely covering over RX (e.g., the RX region 120 of FIG. 2) is measured by a second contact (e.g., a set of electrical contacts) at a second region. The second region is a region where a PC line completely crosses over only the RX region. The measurements in Steps 400 and 405 are shown below, respectively:

> First Capacitance=Capacitance Measurement of 2PC that straddle boundary of $RX$/STI Junction=C1.

> Second Capacitance=Capacitance Measurement of 2PC completely covering over $RX$=2C0.

In FIG. 4, at step 410, measurements for Lpoly are made and delta correction measurements are made for STI ($L_{RX}$, $L_{RX,\ target}$). For example, if the STI region (e.g., the STI region 110 in FIG. 1) is larger or smaller than an approximation of ½ component (i.e., STI region 110 in FIG. 1 under PC 140b being larger or smaller than ½ component), delta corrections (i.e., adjustments) will have to be made to $L_{RX}$. The measurements in step 410 are shown below, respectively:

> Delta Correction for Length of $RX = L_{RX}L_{RX,target}$.

> Length of PC=Lpoly.

In FIG. 4, at step 415, divot capacitance (e.g., Cdivot) is calculated. At step 415, there are several intermediate calculations that are made, including $C1_{RX}$ and C1. The measurements in step 415 are shown below, respectively:

> $C1_{RX}$=Portion of C1 over $RX$=C0+($L_{RX}-L_{RX,target}$) *C0/Lpoly.

> $C1=C1_{RX}$+Cdivot=C0+($L_{RX}-L_{RX,target}$)*C0/Lpoly+ Cdivot.

> Cdivot=Portion over STI=C1-C0-($L_{RX}-L_{RX,target}$) *C0/Lpoly.

In view of the above measurements and calculations, the divot capacitance (e.g., Cdivot) is measured. As described herein, the divot capacitance may be used to estimate divot depth because there is a correlation between divot capacitance and divot depth.

In simulations, for an average FET, +1 nm gate length variation and +1/−1 nm spacer variation was provided. Further, divots greater than 5 nm can be detected above the background noise in accordance with the processes of the present invention. Moreover, when running simulations, Cdivot was calculated to be approximately 120 aF, the divot depth was calculated to be approximately 20 nm (i.e., gate signal is approximately 0.3 fF/um depending on the length).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    measuring a first capacitance at a first region of a substrate where at least one first gate line crosses over a boundary junction between a shallow trench isolation (STI) region and an active region;
    measuring a second capacitance at a second region of the substrate where at least one second gate line crosses over the active region; and
    calculating a capacitance associated with a divot at the first region based on a difference between the first capacitance at the first region and the second capacitance at the second region.

2. The method of claim 1, further comprising determining a depth of the divot based on the calculated divot capacitance.

3. The method of claim 1, wherein the second region is where the at least one second gate line crosses over and completely covers only the active region of the substrate.

4. The method of claim 1, further comprising adjusting the first capacitance for delta corrections in an actual length of the STI at the boundary junction with respect to a reference length of the STI.

5. The method of claim 1, wherein the at least one first gate line comprises at least two first gate lines and the at least one second gate line comprises at least two second gate lines.

6. The method of claim 5, wherein the at least two first gate lines are an outer pair of electrically connected gate lines which cross over the boundary junction between the STI region and the active region of the substrate.

7. The method of claim 5, wherein the at least two second gate lines are an inner pair of electrically connected gate lines which crosses over the active region of the substrate.

8. The method of claim 1, wherein a width of the active region of the substrate is greater than a length of the active region of the substrate.

9. The method of claim 1, wherein the capacitance associated with the divot is calculated by equation 1 below:

$$Cdivot=C1-C0-(L_{RX}-L_{RX,target})*C0/Lpoly, \qquad \text{(equation 1)}$$

wherein the first capacitance is measured as C1, half of the second capacitance is measured as C0, an adjustment of the first capacitance for delta corrections in an actual length of the STI at the boundary junction with respect to a reference length of the STI is ($L_{RX}-L_{RX,\ target}$), and Lpoly is a length of a PC line.

10. A test structure comprising:
    a first contact at a first region where at least one first gate line crosses over a boundary junction between a shallow trench isolation (STI) region and an active region of a substrate for measuring a first capacitance; and a second contact at a second region where at least one second gate line crosses over the active region of the substrate for measuring a second capacitance.

11. The test structure of claim 10, wherein the test structure is used for calculating a divot capacitance of a divot based on a difference between the first capacitance at the first contact and the second capacitance at the second contact.

12. The test structure of claim 11, wherein the test structure is used for determining a depth of the divot based on the calculated divot capacitance.

13. The test structure of claim 11, wherein the test structure is used for adjusting the first capacitance for delta corrections in an actual length of the STI at the boundary junction with respect to a reference length of the STI.

14. The test structure of claim 10, wherein the second region is where the at least one second gate line crosses over and completely covers only the active region of the substrate.

15. A method comprising:
providing a first contact at a first region of a substrate where an outer pair of electrically connected gates crosses over a boundary junction between a shallow trench isolation (STI) region and an active region of a substrate;
providing a second contact at a second region of the substrate where an inner pair of electrically connected gates cross over the active region;
measuring a first capacitance at the first contact and a second capacitance at the second contact; and
calculating a divot capacitance of a divot location based on a difference between the first capacitance at the first contact and the second capacitance at the second contact.

16. The method of claim 15, further comprising determining a depth of the divot based on the calculated divot capacitance.

17. The method of claim 15, further comprising adjusting the first capacitance for delta corrections in an actual length of the STI at the boundary junction with respect to a reference length of the STI.

18. The method of claim 15, wherein the second region is a region where the inner pair of electrically connected gates cross over and completely covers only the active region of the substrate.

19. The method of claim 15, wherein the capacitance associated with the divot location is calculated by equation 2 below:

$$Cdivot = C1 - C0 - (L_{RX} - L_{RX,target}) * C0 / Lpoly, \quad \text{(equation 2)}$$

wherein the first capacitance is measured as C1, half of the second capacitance is measured as C0, an adjustment of the first capacitance for delta corrections in an actual length of the STI at the boundary junction with respect to a reference length of the STI is $(L_{RX} - L_{RX, target})$, and Lpoly is a length of a PC line.

20. The method of claim 15, wherein a width of the active region of the substrate is greater than a length of the active region of the substrate.

* * * * *